United States Patent
Higashide et al.

(10) Patent No.: US 10,122,208 B2
(45) Date of Patent: Nov. 6, 2018

(54) POWER DEVICE

(71) Applicant: Kabushiki Kaisha Toshiba, Minato-ku (JP)

(72) Inventors: Akira Higashide, Yokohama (JP); Hiroki Matsushita, Kawasaki (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 80 days.

(21) Appl. No.: 15/428,296

(22) Filed: Feb. 9, 2017

(65) Prior Publication Data

US 2017/0338690 A1 Nov. 23, 2017

(30) Foreign Application Priority Data

May 20, 2016 (JP) ................ 2016-101039
Feb. 2, 2017 (JP) ................ 2017-017681

(51) Int. Cl.
*H02J 9/06* (2006.01)
*G01R 19/165* (2006.01)
*G01R 31/36* (2006.01)
*H02J 7/00* (2006.01)
*H01M 10/44* (2006.01)
(Continued)

(52) U.S. Cl.
CPC ........ *H02J 9/061* (2013.01); *G01R 19/16576* (2013.01); *G01R 31/362* (2013.01); *H01M 10/441* (2013.01); *H02H 9/004* (2013.01); *H02J 7/0019* (2013.01); *H02J 7/0029* (2013.01); *H02J 7/0036* (2013.01); *H02J 7/0063* (2013.01); *H02J 7/35* (2013.01); *H02J 7/007* (2013.01); *H02J 2007/0067* (2013.01)

(58) Field of Classification Search
CPC ....................................... H02J 9/061
See application file for complete search history.

(56) References Cited

U.S. PATENT DOCUMENTS

| 6,452,362 B1 | 9/2002 | Choo |
|---|---|---|
| 8,810,202 B2 | 8/2014 | Nomura |
| 2013/0076147 A1 | 3/2013 | Sun |

(Continued)

FOREIGN PATENT DOCUMENTS

| EP | 2 670 012 A1 | 12/2013 |
|---|---|---|
| EP | 2 980 954 A1 | 2/2016 |

(Continued)

*Primary Examiner* — Daniel Cavallari
(74) *Attorney, Agent, or Firm* — Oblon, McClelland, Maier & Neustadt, L.L.P.

(57) ABSTRACT

Disclosed is a power device including a connector, a power supply unit, a switch unit, a connector-side voltage detector, a connection determiner, and a switch controller. A battery is detachably connected to the connector. The power supply unit is provided between the connector and external equipment. The switch unit is provided to change over between power supply and power cut-off state unidirectionally from the connector to the power supply unit. The connector-side voltage detector detects a voltage of the connector-side of the switch unit. The connection determiner determines whether the battery is connected to the connector on the basis of the connector-side voltage. The switch controller controls the switch unit such that electric power is supplied unidirectionally from the connector to the power supply unit when the battery is connected.

12 Claims, 6 Drawing Sheets

(51) Int. Cl.
*H02H 9/00* (2006.01)
*H02J 7/35* (2006.01)

(56) References Cited

U.S. PATENT DOCUMENTS

| | | |
|---|---|---|
| 2013/0181526 A1 | 7/2013 | Iwasaki et al. |
| 2013/0307479 A1 | 11/2013 | Kim |
| 2014/0319914 A1 | 10/2014 | Nomura |
| 2015/0022140 A1 | 1/2015 | Heishi et al. |
| 2016/0049813 A1* | 2/2016 | Takizawa ............ H01M 10/441 320/112 |

FOREIGN PATENT DOCUMENTS

| | | |
|---|---|---|
| EP | 2 985 857 A1 | 2/2016 |
| JP | H10-341535 A | 12/1998 |
| JP | 2013-179836 | 9/2013 |
| JP | 2014-079076 A | 5/2014 |
| JP | 2014-79139 A | 5/2014 |
| JP | 2014-103822 A | 6/2014 |
| JP | 2014-124064 A | 7/2014 |
| JP | 2016-073021 A | 5/2016 |

\* cited by examiner

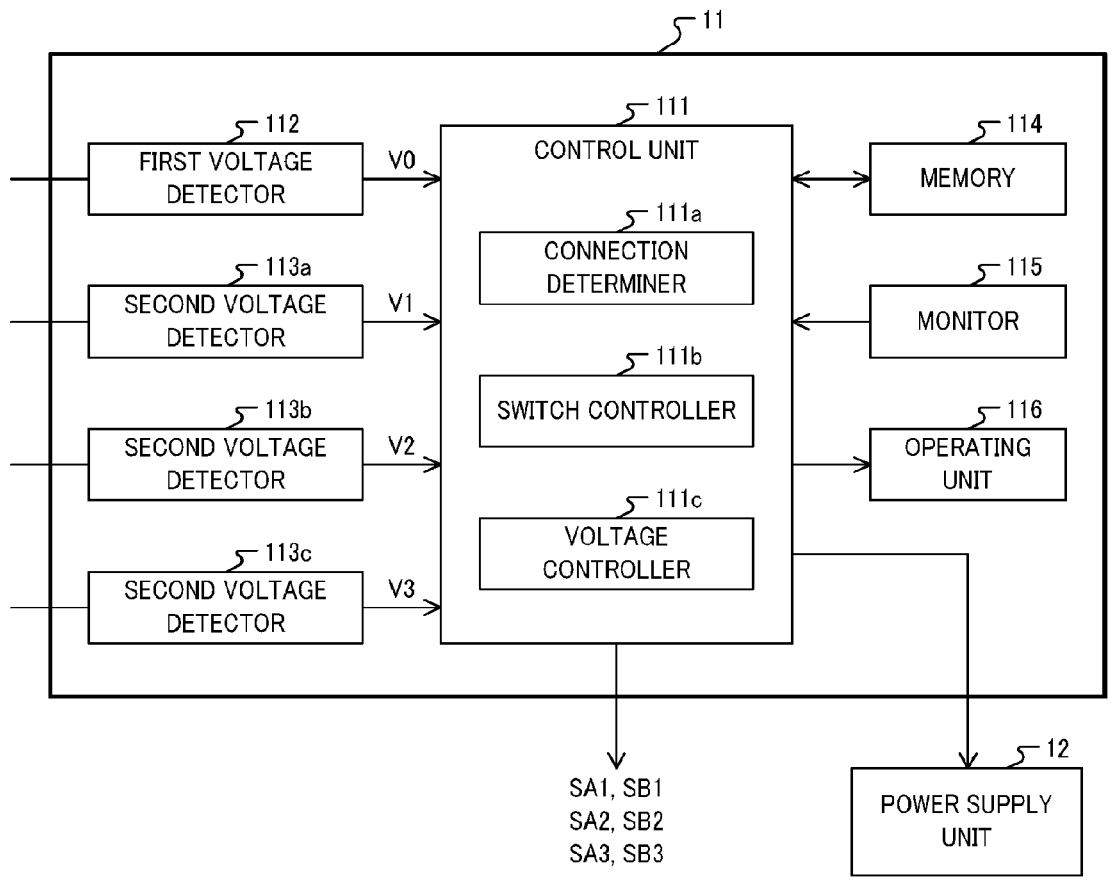

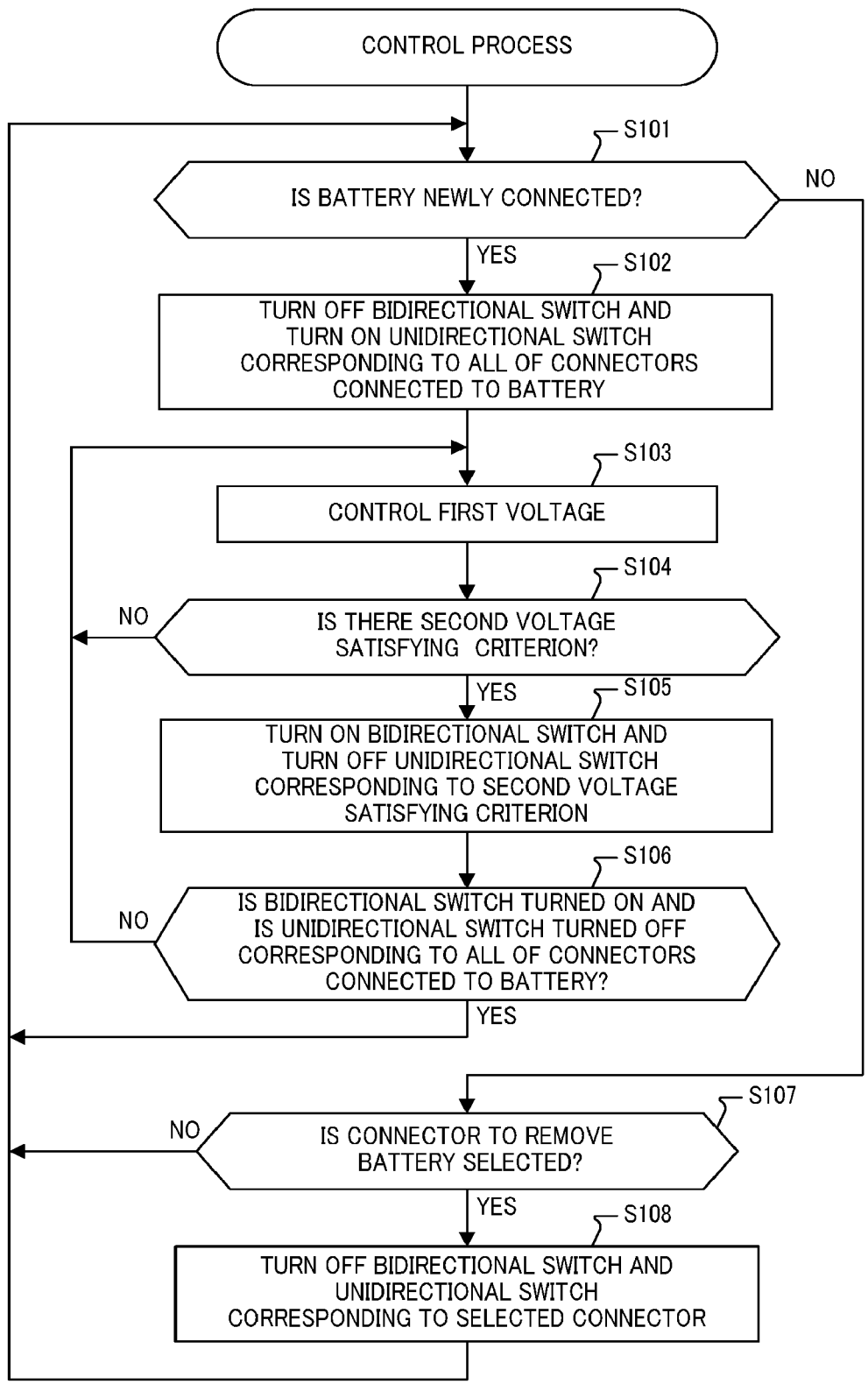

FIG. 5

| ACT No. | VOLTAGE | | | | BIDIRECTIONAL SWITCH, UNIDIRECTIONAL SWITCH | | | | | |
|---|---|---|---|---|---|---|---|---|---|---|
| | V0 | V1 | V2 | V3 | SA1 | SB1 | SA2 | SB2 | SA3 | SB3 |
| 0 | 55 | 0 | 0 | 0 | OFF | OFF | OFF | OFF | OFF | OFF |
| 1 | 55 | 40 | 0 | 0 | OFF | ON | OFF | OFF | OFF | OFF |
| 2 | 40 | 40 | 0 | 0 | ON | OFF | OFF | OFF | OFF | OFF |
| 3 | 40 | 40 | 45 | 0 | OFF | ON | OFF | ON | OFF | OFF |
| 4 | 50 | 40 | 45 | 0 | OFF | ON | OFF | ON | OFF | OFF |
| 5 | 45 | 40 | 45 | 0 | OFF | ON | ON | OFF | OFF | OFF |
| 6 | 40 | 40 | 40 | 0 | ON | OFF | ON | OFF | OFF | OFF |
| 7 | 40 | 40 | 40 | 50 | OFF | ON | OFF | ON | OFF | ON |
| 8 | 55 | 40 | 40 | 50 | OFF | ON | OFF | ON | OFF | ON |
| 9 | 50 | 40 | 40 | 50 | OFF | ON | OFF | ON | ON | OFF |
| 10 | 40 | 40 | 40 | 40 | ON | OFF | ON | OFF | ON | OFF |
| 11 | 40 | 40 | 40 | 40 | OFF | OFF | ON | OFF | ON | OFF |
| 12 | 40 | 0 | 40 | 40 | OFF | OFF | ON | OFF | ON | OFF |

FIG. 6

| ACT No. | VOLTAGE | | | | BIDIRECTIONAL SWITCH, UNIDIRECTIONAL SWITCH | | | | | |
|---|---|---|---|---|---|---|---|---|---|---|
| | V0 | V1 | V2 | V3 | SA1 | SB1 | SA2 | SB2 | SA3 | SB3 |
| 13 | 40 | 40 | 40 | 40 | ON | OFF | ON | OFF | OFF | ON |
| 14 | 55 | 55 | 55 | 40 | OFF | OFF | OFF | OFF | OFF | ON |
| 15 | 40 | 0 | 0 | 40 | OFF | OFF | OFF | OFF | ON | OFF |

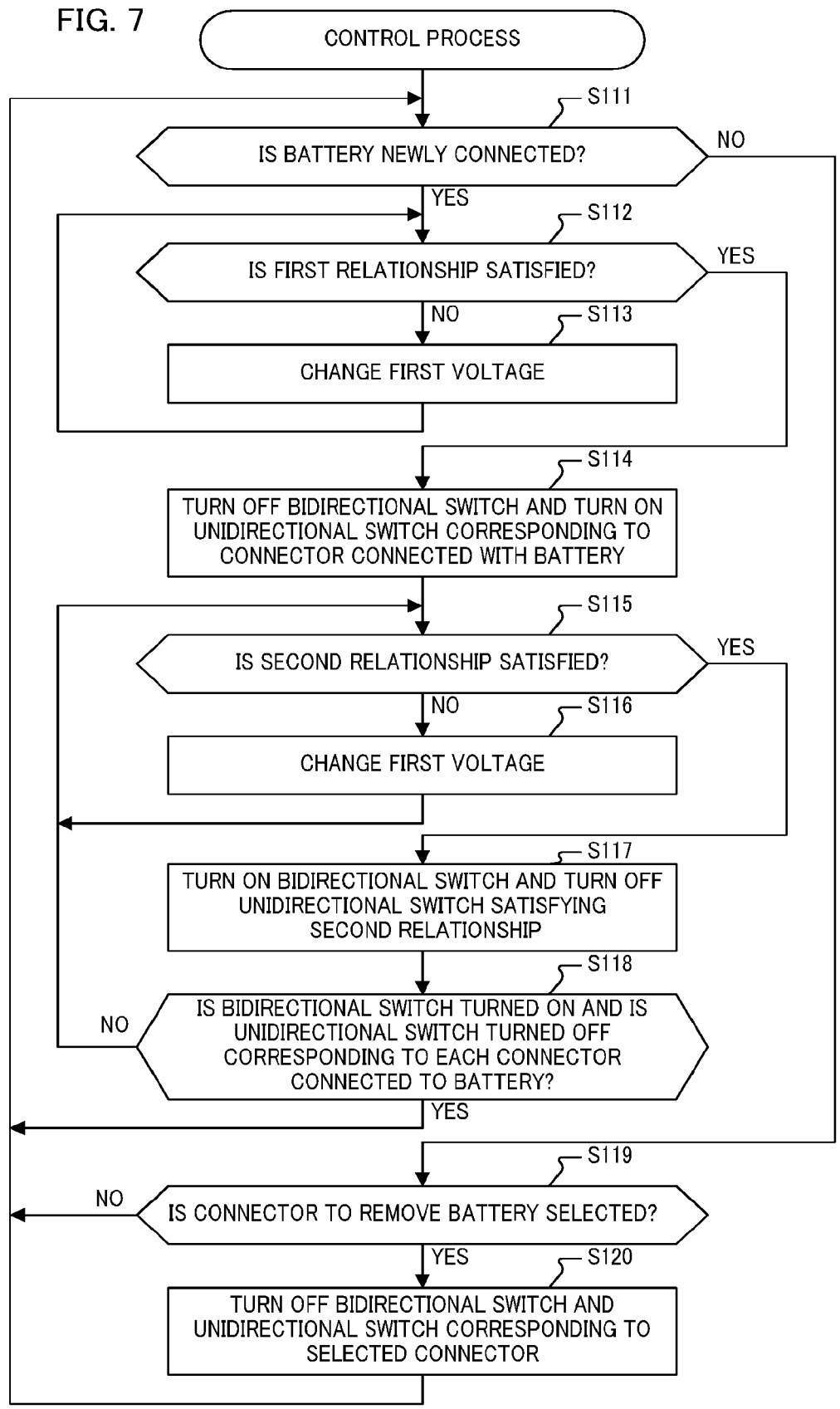

FIG. 8

| ACT | VOLTAGE | | | | BIDIRECTIONAL SWITCH, UNIDIRECTIONAL SWITCH | | | | | |
|---|---|---|---|---|---|---|---|---|---|---|
| No. | V0 | V1 | V2 | V3 | SA1 | SB1 | SA2 | SB2 | SA3 | SB3 |
| 0 | 55 | 0 | 0 | 0 | OFF | OFF | OFF | OFF | OFF | OFF |
| 1 | 55 | 40 | 0 | 0 | OFF | ON | OFF | OFF | OFF | OFF |
| 2 | 40 | 40 | 0 | 0 | ON | OFF | OFF | OFF | OFF | OFF |
| 3 | 40 | 40 | 45 | 0 | ON | OFF | OFF | OFF | OFF | OFF |
| 4 | 50 | 40 | 45 | 0 | OFF | ON | OFF | ON | OFF | OFF |
| 5 | 45 | 40 | 45 | 0 | OFF | ON | ON | OFF | OFF | OFF |
| 6 | 40 | 40 | 40 | 0 | ON | OFF | ON | OFF | OFF | OFF |
| 7 | 40 | 40 | 40 | 50 | ON | OFF | ON | OFF | OFF | OFF |
| 8 | 55 | 40 | 40 | 50 | OFF | ON | OFF | ON | OFF | ON |
| 9 | 50 | 40 | 40 | 50 | OFF | ON | OFF | ON | ON | OFF |
| 10 | 40 | 40 | 40 | 40 | ON | OFF | ON | OFF | ON | OFF |
| 11 | 40 | 40 | 40 | 40 | OFF | OFF | ON | OFF | ON | OFF |
| 12 | 40 | 0 | 40 | 40 | OFF | OFF | ON | OFF | ON | OFF |

POWER DEVICE

CROSS-REFERENCE TO RELATED APPLICATION

This application is based upon and claims the benefit of priority from the prior Japanese Patent Application No. 2016-101039, filed on May 20, 2016, and the prior Japanese Patent Application. No. 2017-017681, filed on Feb. 2, 2017, the entire contents of which are incorporated herein by reference.

FIELD

Embodiments of the present invention relate to a power device.

BACKGROUND

A power device detachably installed with a battery is known in the art. When the battery is removed from or installed in the power device during operation (hot swapping), an inrush current flows from the power device to the battery or from the battery to the power device in some times. This inrush current may generate a failure of the power device or the battery, or an electrical shock accident.

A battery management unit (BMU) is known in the art as a unit for preventing a failure of the battery caused by a large current such as the inrush current.

However, as the number of detachable batteries increases, a throughput of the battery management unit increases, and a configuration of the power device becomes complicated.

DESCRIPTION OF THE DRAWINGS

FIG. 2 is a diagram illustrating a configuration of a system controller of FIG. 1.

FIG. 3 is a diagram illustrating a structure of state data according to the first embodiment.

FIG. 4 is a flowchart illustrating a control process performed by the power device according to the first embodiment.

FIG. 5 is a chronological table showing each state of bidirectional and unidirectional switches controlled on the basis of a relationship between first and second voltages according to the first embodiment.

FIG. 6 is a chronological table showing each state of the bidirectional and unidirectional switches according to the first embodiment when a selected group of batteries are charged preferentially.

FIG. 7 is a flowchart illustrating a control process performed by the power device according to a second embodiment of the invention.

FIG. 8 is a chronological table showing each state of the bidirectional and unidirectional switches controlled on the basis of a relationship between first and second voltages according to the second embodiment.

DETAILED DESCRIPTION

Figure 1:
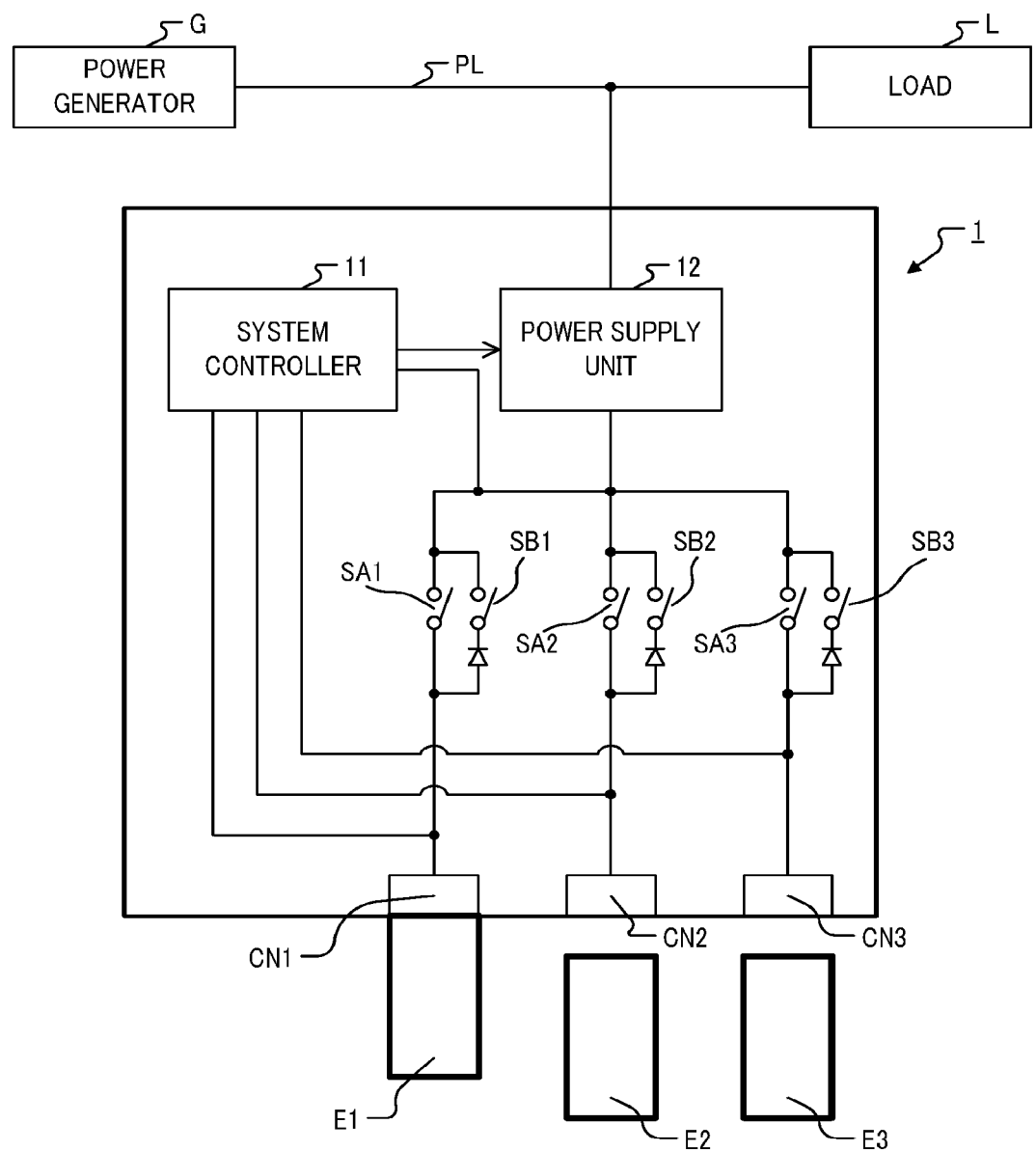
FIG. 1 is a diagram illustrating a configuration of a power device according to a first embodiment of the invention.

A power device according to an embodiment of the invention includes a connector, a power supply unit, a switch unit, a connector-side voltage detector, a connection determiner, and a switch controller. A battery is detachably connected to the connector. The power supply unit is provided between the connector and external equipment to supply electric power to the external equipment. The switch unit is provided to change over between power supply and a power cut-off states unidirectionally from the connector to the power supply unit. The connector-side voltage detector detects a connector-side voltage of the switch unit. The connection determiner determines whether or not the battery is connected to the connector on the basis of the connector-side voltage detected by the connector-side voltage detector. The switch controller controls the switch unit such that electric power is supplied unidirectionally from the connector to the power supply unit when the connection determiner determines that the battery is connected.

First Embodiment

A power device according to a first embodiment of the invention will now be described with reference to the accompanying drawings.

As illustrated in FIG. 1, the power device 1 is connected to a power line PL connected to a power generator G such as a photovoltaic generator and a load L such as various types of electric equipment. In addition, a plurality of batteries E1, E2, and E3 (collectively referred to as a battery E) are detachably connected to the power device 1. The power device 1 safely and reliably performs installation/removal (hot swapping) of the battery E and charging/discharging of the battery E.

The power device 1 is provided with connectors CN1, CN2, and CN3 (collectively referred to as a connector CN), a system controller 11, a power supply unit 12, bidirectional switches SA1, SA2, and SA3 (collectively referred to as a bidirectional switch SA), and unidirectional switches SB1, SB2, and SB3 (collectively referred to as a unidirectional switch SB).

The connector CN is, for example, a receptacle connector. Each connector CN is provided with a connection terminal to which the battery E is detachably connected.

The battery E includes, for example, a lithium-ion battery or a nickel-hydrogen battery. The battery E may be appropriately changed depending on where the power device 1 is applied. The battery E includes a single cell structure, a cell module formed by combining a plurality of cells, an electric device having a charge storage function, and the like.

As illustrated in FIG. 2, the system controller 11 includes a control unit 111, a first voltage detector 112, second voltage detectors 113a, 113b, and 113c (collectively referred to as a second voltage detector 113), a memory 114, a monitor 115, and an operating unit 116.

The control unit 111 is provided with a central processing unit (CPU), a random access memory (RAM) serving as a main memory of the CPU, a timer, and the like. The control unit 111 is connected to the power supply unit 12, each bidirectional switch SA, each unidirectional switch SB, the first voltage detector 112, each second voltage detector 113, the memory 114, the monitor 115, and the operating unit 116 via a data line used to transmit commands or data to control each of them.

When the power device 1 is powered on, the control unit 111 reads and executes a control program stored in the memory 114. As a result, the control unit 111 serves as the connection determiner 111a, the switch controller 111b, and the voltage controller 111c and executes a control process described below.

The first and second voltage detectors 112 and 113 include voltage sensors or the like.

The first voltage detector 112 is connected to the power line between the power supply unit 12 and the bidirectional switch SA. The first voltage detector 112 detects a voltage of this power line, that is, a voltage V0 of the power supply unit 12 side of the bidirectional switch SA. The voltage V0 detected by the first voltage detector 112 will be referred to as a first voltage. The first voltage detector 112 supplies a signal representing the first voltage to the control unit 111.

The second voltage detector 113 is connected to the power line between the connector CN and the bidirectional switch SA. The second voltage detector 113 detects a voltage of this power line, that is, a voltage of the connector CN side of the bidirectional switch SA. Specifically, the second voltage detector 113a is connected to the power line between the connector CN1 and the bidirectional switch SA1 to detect a voltage V1 of the connector CN1 side of the bidirectional switch SA1. Similarly, the second voltage detector 113b detects a voltage V2 of the connector CN2 side of the bidirectional switch SA2. The second voltage detector 113c detects a voltage V3 of the connector CN3 side of the bidirectional switch SA3. The voltages V1, V2, and V3 detected by the second voltage detector 113 will be referred to as a second voltage. The second voltage detector 113 supplies a signal representing the second voltage to the control unit 111.

The memory 114 includes a memory device such as a read-only memory (ROM) or a flash memory. The memory 114 stores a control program and data used by the control unit 111 to execute control processes described below, and various data generated or obtained by allowing the control unit 111 to execute various processes. The data used to execute the control processes described below includes data for controlling the bidirectional switch SA, the unidirectional switch SB, and the power supply unit 12.

Specifically, the memory 114 stores data used in control to turn on the bidirectional switch SA and turn off the unidirectional switch SB. This control is performed on the basis of whether or not the first and second voltages are equal to each other. This criterion is to determine whether or not the battery E has a chargeable/dischargeable state. If this criterion is satisfied (when the first and second voltages are equal to each other), the bidirectional switch SA is turned on, and the unidirectional switch SB is turned off.

In addition, the memory 114 stores data used in control to turn off the bidirectional switch SA and turn on the unidirectional switch SB. This control is performed when the battery E is newly installed. In addition, the memory 114 stores data used to control the first voltage such that the first and second voltages become equal to each other. This control is also performed when the battery E is newly installed. Furthermore, the memory 114 stores data used in control to turn off both the bidirectional switch SA and the unidirectional switch SB. This control is performed when operation for instructing removal of the battery E is made.

As illustrated in FIG. 3, the memory 114 stores state data representing each state of the second voltage detector 113, the bidirectional switch SA, and the unidirectional switch SB. The control unit 111 detects the second voltage for each second voltage detector 113 by referring to the state data and updates and stores the detected second voltage. In addition, the control unit 111 controls the bidirectional switch SA and the unidirectional switch SB by referring to the state data. The ON/OFF states of the bidirectional switch SA and the unidirectional switch SB represented by the state data are sequentially updated and stored in the control unit ill.

The memory 114 stores various display information displayed on the monitor 115. In addition, the memory 114 stores various setting information set on the basis of user's operation using the operating unit 116.

The monitor 115 includes a display interface devices such as a liquid crystal display (LCD) and an organic electroluminescence (EL) device. The monitor 115 displays, on a screen, various types of information such as a connection state of the battery E in each connector CN (presence/absence of the battery E), the first voltage detected by the first voltage detector 112, the second voltage detected by the second voltage detector 113, information representing whether or not charging or discharging can be performed (such as "chargeable/dischargeable state," "dischargeable state," and "non-chargeable/dischargeable state"), and a charging processing level (such as "under charging" or "charging completed"). Note that the monitor 115 may be provided in positions corresponding to each connector CN to display various types of information corresponding to each connector CN.

The operating unit 116 includes an input interface device for receiving user's operation. The operating unit 116 supplies the control unit 111 with an operation signal corresponding to the user's operation. The operating unit 116 receives, for example, operation for setting an initial value and upper and lower limits of the first voltage. The control unit ill stores various types of setting information in the memory 114 in response to the user's operation using the operating unit 116. Note that the operating unit 116 may be provided in each position corresponding to each connector CN.

The power supply unit 12 includes a power conditioner (power converter) such as a DC-AC inverter circuit, an AC-DC converter circuit, or a DC-DC converter circuit. The power supply unit 12 converts the AC power supplied from the power generator G into DC power and supplies the converted DC power to the battery E connected to the connector CN (for charging). In addition, the power supply unit 12 converts the DC power supplied (discharged) from each battery E into AC power and supplied the converted AC power to the load L. The power supply unit 12 receives, for example, a pulse width modulation (PWM) signal from the voltage controller 111c and supplies electric power in response to this signal. Note that a resistor (pull-down resistor) of 1 kΩ may be arranged in the ground side of the power supply unit 12.

The bidirectional switch SA is provided between the connector CN and the power supply unit 12. The bidirectional switch SA includes a switch circuit (bidirectional switch) such as a TRIAC (bidirectional thyristor), a metal-oxide semiconductor field effect transistor (MOSFET), an insulated gate bipolar transistor (IGBT), or a bipolar transistor. The bidirectional switch is implemented in a so-called back-to-back manner in which, for example, sources of a pair of MOSFETs of the same channel are connected to each other. The bidirectional switch SA changes over between power supply and a power cut-off states bidirectionally between the power supply unit 12 and the connector CN. When the bidirectional switch SA is turned on, electric power is supplied bidirectionally between the power supply unit 12 and the connector CN (chargeable/dischargeable state). In contrast, when the bidirectional switch SA is turned off, electric power is cut off between the power supply unit 12 and the connector CN (non-chargeable/dischargeable state).

The unidirectional switch SB is provided between the connector CN and the power supply unit 12. The unidirectional switch SB is connected to the bidirectional switch SA in parallel. In addition, the unidirectional switch SB includes a switch circuit (unidirectional switch) such as a thyristor, a MOSFET, an IGBT, or a bipolar transistor. The unidirectional switch SB changes over between power supply and power cut-off states unidirectionally from the connector CN to the power supply unit 12. When the unidirectional switch SB is turned on, power is supplied unidirectionally from the connector CN to the power supply unit 12 (only dischargeable state). In contrast, when the unidirectional switch SB is turned off, supply of power from the connector CN to the power supply unit 12 is cut off (non-dischargeable state).

A control process performed by the control unit 111 in the power device 1 configured in this manner will be described in brief.

The control processes can be classified into a control process executed when the battery E is installed and a control process executed when the battery E is removed.

The control process executed when the battery E is installed has a process of setting overall batteries E connected to the power device 1 to the "only-dischargeable" state and a process of setting all of the batteries E connected to the power device 1 to the "chargeable/dischargeable" state. Meanwhile, the control process executed when the battery E is removed has a process of setting the batteries E to the "non-chargeable/dischargeable" state.

The control processes executed by the control unit 111 will be described with reference to FIGS. 4 and 5. Here, a control process executed when the battery E1 is installed in the connector CN1 will be described by assuming that the battery E is not connected to any one of each connector CN of the power device 1 (Operation No. 0 in FIG. 5).

The connection determiner 111a periodically obtains a signal representing the first voltage from the first voltage detector 112 and sequentially updates and stores it. In addition, the connection determiner 111a periodically obtains a signal representing the second voltage from each second voltage detector 113 by referring to the state data of FIG. 3. Furthermore, the connection determiner 111a updates and stores the second voltage detected by each second voltage detector 113.

The connection determiner 111a determines whether or not the battery E is newly installed on the basis of the second voltage (step S101). Specifically, the connection determiner 111a determines whether or not the battery E is newly installed on the basis of whether or not the second voltage increases to a certain value or higher. For example, the second voltage V1 (=40 V) of Operation No. 1 increases from the second voltage V1 (=0 V) of Operation No. 0. In this case, the connection determiner 111a determines that the battery E is newly installed.

If it is determined that the battery E is installed (YES in step S101), the switch controller 111b turns off the bidirectional switch SA and turns on the unidirectional switch SB corresponding to all of the connectors CN connected to the battery E (step S102). As a result, overall batteries E connected to the power device 1 are set to the dischargeable state.

Specifically, the switch controller 111b refers to the state data of FIG. 3. The switch controller 111b turns off the bidirectional switch SA and turns on the unidirectional switch SB respectively corresponding to all of the second voltages exceeding a predetermined value (for example, 0 V), out of the second voltages. For example, in Operation No. 1, out of the second voltages V1, V2, and V3 temporarily stored, only the second voltage V1 (=40 V) exceeds a predetermined value. In this case, the switch controller 111b turns off the bidirectional switch SA1 and turns on the unidirectional switch SB1 corresponding to the second voltage V1. As a result, the battery E1 connected to the connector CN1 becomes the dischargeable state. Note that, since the bidirectional switch SA is turned off in this state, the battery E is not charged, and the second voltage does not follow a change of the first voltage.

Subsequently, the voltage controller 111c controls the first voltage using the power supply unit 12 on the basis of the second voltage (voltage of the battery E) determined to be installed with the battery E (step S103). The voltage controller 111c controls the first voltage such that the first and second voltages become equal to each other.

If the first voltage is higher than the second voltage, the voltage controller 111c decreases the first voltage until the first and second voltages become equal to each other. For example, the first voltage V0 (=55 V) in Operation No. 1 may decrease until it becomes equal to the second voltage V1 (=40 V). In addition, if the first voltage is lower than the second voltage, the voltage controller 111c increases the first voltage such that the first voltage is higher than the second voltage. Then, the voltage controller 111c decreases the first voltage such that the first and second voltages become equal to each other.

Meanwhile, the switch controller 111b determines whether or not there is a second voltage satisfying a criterion (step S104). For example, the second voltage V1 (=40 V) in Operation No. 2 is equal to the first voltage V0 (=40 V). In this case, the switch controller 111b determines that there is a second voltage satisfying the criterion.

If the switch controller 111b determines that there is no second voltage satisfying the criterion (NO in step S104), the voltage controller 111c returns to step S103 and controls the first voltage.

Meanwhile, if it is determined that there is a second voltage that satisfies the criterion (YES in step S104), the switch controller 111b turns on the bidirectional switch SA and turns off the unidirectional switch SB corresponding to the second voltage (step S105). For example, in Operation No. 2, the bidirectional switch SA1 is turned on, and the unidirectional switch SB1 is turned off corresponding to the second voltage V1. As a result, the battery E1 connected to the connector CN1 has the chargeable/dischargeable state. That is, out of a plurality of groups of the connectors CN, the bidirectional switches SA, and the unidirectional switches SB, the switch controller 111b turns on the bidirectional switch SA and turns off the unidirectional switch SB for the group determined to satisfy the criterion. Note that, in this state (as the bidirectional switch SA is turned on), the second voltage becomes equal to the first voltage and follows a change of the first voltage.

Then, the switch controller 111b determines whether or not the bidirectional switches SA are turned on, and the unidirectional switches SB are turned off corresponding to all of the connectors CN connected to the battery E (step S106). That is, the switch controller 111b determines whether or not all of the connected batteries E have the chargeable/dischargeable state.

For example, in Operation No. 2, the bidirectional switch SA1 is turned on, and the unidirectional switch SB1 is turned off corresponding to the connector CN1. In addition, the batteries E2 and E3 are not connected to the connectors CN2 and CN3, respectively (the second voltages V2 and V3 are set to zero).

In this case, the switch controller 111b determines that all of the connected batteries E have the chargeable/dischargeable state.

If it is determined that all of the connected batteries E do not have the chargeable/dischargeable state (NO in step S106), the switch controller 111b returns to step S103 and performs the aforementioned process.

Meanwhile, if it is determined that all of the connected batteries E have the chargeable/dischargeable state (YES in step S106), the switch controller 111b returns to step S101. That is, in this case, a series of control processes for a case when the battery E is installed are completed.

Note that the control process of steps S101 to S106 is also performed even when other batteries E2 and E3 are installed.

For example, if the battery E2 is installed in the connector CN2 while the battery E1 is connected to the connector CN1 (Operation No. 3), the connection determiner 111a turns off the bidirectional switches SA1 and SA2 and turns on the unidirectional switches SB1 and SB2 corresponding to the connectors CN1 and CN2, respectively, so that the batteries E1 and E2 are set to the dischargeable state (YES in step S101, and step S102).

The voltage controller 111c controls the first voltage V0 such that the first voltage V0 (=40 V) in Operation No. 3 becomes equal to the second voltage V2 (=45 V) (step S103). Since the first voltage V0 is lower than the second voltage V2, the voltage controller 111c increases the first voltage V0 to 50V (in Operation No. 4) such that the first voltage V0 is higher than the second voltage V2. Then, the voltage controller 111c decreases the first voltage V0 such that the first voltage V0 becomes equal to the second voltage V2.

As a result, the first voltage V0 (=45 V) in Operation No. 5 becomes equal to the second voltage V2 (=45 V). The switch controller 111b turns on the bidirectional switch SA2 and turns off the unidirectional switch SB2 corresponding to the second voltage V2 (=45 V) (YES in step S104, and step S105). As a result, the battery E2 connected to the connector CN2 has the chargeable/dischargeable state.

The voltage controller 111c controls the first voltage V0 such that the first voltage V0 (=45 V) in Operation No. 5 becomes equal to the second voltage V1 (=40 V) (NO in step S106, and step S103). As a result, the first voltage V0 (=40 V) in Operation No. 6 becomes equal to the second voltage V1 (=40 V). The switch controller 111b turns on the bidirectional switch SA1 and turns off the unidirectional switch SB1 corresponding to the second voltage V1 (=40 V) (YES in step S104, and step S105). As a result, the battery E1 connected to the connector CN1 also has the chargeable/dischargeable state.

If the battery E3 is installed in the connector CN3 while the batteries E1 and E2 are connected to the connectors CN1 and CN2, respectively (in Operation No. 7), the connection determiner 111a turns off the bidirectional switches SA1, SA2, and SA3 and turns on the unidirectional switches SB1, SB2, and SB3 corresponding to the connectors CN1, CN2, and CN3, respectively, so that the batteries E1, E2, and E3 are set to the dischargeable state (YES in step S101, and step S102).

The voltage controller 111c controls the first voltage V0 such that the first voltage V0 (=40 V) in Operation No. 7 becomes equal to the second voltage V3 (=50 V) (step S103). The voltage controller 111c increases the first voltage V0 up to 55 V such that the first voltage V0 becomes higher than the second voltage V3 (Operation No. 8). Then, the voltage controller 111c decreases the first voltage V0 such that the first voltage V0 becomes equal to the second voltage V3.

As a result, the first voltage V0 (=50 V) in Operation No. 9 becomes equal to the second voltage V3 (=50 V). The switch controller 111b turns on the bidirectional switch SA2 and turns off the unidirectional switch SB2 corresponding to the second voltage V3 (=50 V) (YES in steps S104, and step S105). As a result, the battery E3 connected to the connector CN3 has the chargeable/dischargeable state.

The voltage controller 111c controls the first voltage V0 such that the first voltage V0 (=50 V) in Operation No. 9 becomes equal to the second voltages V1 and V2 (=40 V) (NO in step S106, and step S103). As a result, the first voltage V0 (=40 V) in Operation No. 10 becomes equal to the second voltages V1 and V2 (=40V). The switch controller 111b turns on the bidirectional switches SA1 and SA2 and turns off the unidirectional switches SB1 and SB2 corresponding to the second voltages V1 and V2 (=40V), respectively (YES in step S104, and step S105). As a result, the batteries E1 and E2 connected to the connectors CN1 and CN2 also have the chargeable/dischargeable state.

In this manner, the battery E is installed in each connector CN.

Meanwhile, if it is determined that the battery E is not installed in step S101 (NO in step S101), the connection determiner 111a determines whether or not the connector CN to remove the battery E is selected (step S107). For example, a user checks a connection state (presence/absence of the battery E) of each connector CN displayed on the monitor 115 and performs operation for selecting the connector CN to remove the battery E using the operating unit 116. Specifically, in Operation No. 11, if a user performs operation for selecting the connector CN1, the connection determiner 111a determines that the connector CN to remove the battery E is selected.

If it is determined that the connector CN to remove the battery E is not selected in the process of step S107 (NO in step S107), the connection determiner 111a returns to step S101 and performs the same process as that described above.

Meanwhile, if the connection determiner 111a determines that the connector CN to remove the battery E is selected (YES in step S107), the switch controller 111b turns off both the unidirectional switch SB and the bidirectional switch SA corresponding to the selected connector CN (step S108). As a result, it is possible to safely remove the selected battery E while the battery E is set to the non-chargeable/dischargeable state. Then, the connection determiner 111a notifies the monitor 115 of a fact that the battery E is removed. For example, in Operation No. 12, if a user removes the battery E1 from the connector CN1, the second voltage V1 becomes 0 V.

As described above, the power device 1 according to the first embodiment maintains the bidirectional switch SA in the OFF state until the first voltage between the power supply unit 12 and the bidirectional switch SA and the second voltage between the connector CN and the bidirectional switch SA satisfy the criterion (become equal to each other). In addition, if the criterion is satisfied, the bidirectional switch SA is turned on. That is, if the battery E is connected to the connector CN during the operation of the power device 1, the charging/discharging of the battery E is not performed until the first and second voltages satisfy the criterion. Meanwhile, if the criterion is satisfied, the bidirectional switch SA is controlled to perform charging/discharging. Using the power device 1, it is possible to safely and reliably perform installation/removal and charging/discharging of the battery E during the operation of the power device 1.

Note that, although the bidirectional switch SA and the unidirectional switch SB are controlled on the basis of whether or not the first and second voltages are equal to each other in the aforementioned embodiment, this criterion may be appropriately and arbitrarily changed as long as it is recognized that the battery E has the chargeable/dischargeable state. For example, a threshold value may be set for a voltage difference or ratio between the first and second voltages, and this threshold value may be used as a criterion to turn on the bidirectional switch SA and turn off the unidirectional switch SB.

The first voltage is controlled such that the first and second voltages satisfy the criterion using the voltage controller 111c when a battery E is newly installed. As a result, it is possible to effectively set the newly installed battery E to the chargeable/dischargeable state.

When the battery E is newly installed, the unidirectional switch SB is turned on. As a result, it is possible to supply (discharge) electric power unidirectionally from the connector CN to the power supply unit 12. Since the power device 1 can maintain the dischargeable state from the connected battery E, it is possible to take a countermeasure even when an unexpected voltage drop (such as an instantaneous interruption) occurs in external equipment (such as the power generator G or the load L).

Out of a plurality of groups of the connectors CN, the bidirectional switches SA, and the unidirectional switches SB, the switch controller 111b turns on the bidirectional switch SA and turns off the unidirectional switch SB belonging to the group determined to satisfy the criterion. As a result, it is possible to effectively set the corresponding battery E in the chargeable/dischargeable state in order sequentially from the group determined to satisfy the criterion.

In the embodiment described above, user's operation for selecting the connector CN to remove the battery E is received, and both the unidirectional switch SB and the bidirectional switch SA corresponding to the selected connector CN are turned off in response to the user's operation. However, if two or more batteries E are connected, the batteries E can be safely removed without performing this process. If a single battery E is removed while two or more batteries E are connected, the other battery E has low impedance. Therefore, the electric current flowing through the removed battery E flows to the other battery E. Consequently, no inrush current is generated between the removed battery E and the connector CN. Therefore, if two or more batteries E are connected, the switch controller 111b receives removal of the battery E at any time, and the bidirectional switch SA and the unidirectional switch SB may not be turned off when the battery E is removed. Meanwhile, if a single battery E is connected, the switch controller 111b turns off the bidirectional switch SA and the unidirectional switch SB when the connector CN to remove the battery E is selected. As a result, it is possible to safely perform the removal even when only a single battery E is connected.

The switch controller 111b may receive operation for selecting a group for which the charging is to be preferentially performed out of a plurality of groups and may preferentially charge the battery E corresponding to the group selected by a user.

For example, the switch controller 111b receives operation for selecting a group having the chargeable/dischargeable state. A user checks the state of the battery E for each group displayed on the monitor 115 and performs operation for selecting a group for which the charging is preferentially performed using the operating unit 116.

Specifically, as illustrated in FIG. 6, if a user selects each group having the connectors CN1 and CN2 in Operation No. 13, the switch controller 111b turns on the bidirectional switches SA1 and SA2 and turns off the unidirectional switches SB1 and SB2 of the selected group. In addition, the switch controller 111b turns off the bidirectional switch SA3 and turns on the unidirectional switch SB3 of the non-selected group. That is, the batteries E1 and E2 belonging to the selected group are set to the chargeable/dischargeable state, and the battery E3 belonging to the non-selected group is set to the only dischargeable state. Then, the voltage controller 111c controls the power supply unit 12 such that the power supply unit 12 performs charging until the batteries E1 and E2 corresponding to the selected group have a predefined voltage (for example, 55 V). As a result, it is possible to preferentially perform charging of the battery E corresponding to the group selected by a user.

In Operation No. 14, if the charging for the batteries E1 and E2 corresponding to the selected group is completed (when charged to 55V), the switch controller 111b turns off both the bidirectional switches SA1 and SA2 and the unidirectional switches SB1 and SB2 of the corresponding group. As a result, it is possible to set the selected battery E in a non-chargeable/dischargeable state and safely remove the selected battery E. In addition, the switch controller 111b displays a fact that the charging is completed for the selected group on the monitor 115 to notify a user.

Then, in Operation No. 15, the switch controller 111b turns on the bidirectional switch SA3 of the non-selected group and turns off the unidirectional switch SB3 so that the battery E3 corresponding to the non-selected group has the chargeable/dischargeable state. Alternatively, the voltage controller 111c may allow the power supply unit 12 to perform charging until the battery E3 corresponding to the non-selected group has a predefined voltage (for example, 55 V).

The switch controller 111b may receive operation for setting a charging sequence and charge the battery E in order along the sequence set by a user. In this case, the switch controller 111b turns on the bidirectional switch SA and turns off the unidirectional switch SB corresponding to the connector CN connected to the charging target battery E in order along the sequence set by a user, so that the corresponding battery E has the chargeable/dischargeable state. Meanwhile, the switch controller 111b turns off the bidirectional switch SA and turns on the unidirectional switch SB corresponding to the connector CN connected to the non-charging target battery E, so that the corresponding battery E has an only dischargeable state. The voltage controller 111c sequentially repeats a process of allowing the power supply unit 12 to perform charging in order along the sequence set by a user until the charging target battery E has a predefined voltage (for example, 55 V).

When the battery E is removed, the connection determiner 111a may determine whether or not its removal is allowed on the basis of the state of the load L. For example, the connection determiner 111a obtains a power consumption of the load L when the connector CN from which the battery E is removed is selected depending on user's operation. If the power consumption is higher than a threshold value, the connection determiner 111a locks the corresponding connector CN and inhibits removal of the battery E from the connector CN. Otherwise, if the power consumption is not higher than the threshold value, the connection determiner 111a unlocks the connector CN and allows the battery E to be removed from the connector CN.

Second Embodiment

Next, a power device according to a second embodiment will be described. Like reference numeral denote like elements as in the first embodiment, and they will not be described repeatedly.

According to the second embodiment, a switch unit (including a bidirectional switch SA and a unidirectional switch SB) corresponding to a connector CN connected to a battery E is controlled on the basis of a relationship between a voltage (first voltage V0) of the power supply unit 12 side and a voltage (second voltages V1 to V3) of the connector CN side of the switch unit.

Specifically, a first relationship is established in advance for a case where the first voltage V0 is higher than the second voltage V1, V2, and V3. If first relationship is satisfied, the switch controller 111b turns off the bidirectional switch SA and turns on the unidirectional switch SB. That is, this control is performed on the basis of whether or not the first voltage is higher than the second voltage. If the bidirectional switch SA is turned off, and the unidirectional switch SB is turned on, the battery E connected to the connector CN corresponding to this switch unit has an only dischargeable state.

If the first relationship is not satisfied, the voltage controller 111c changes the first voltage V0 such that the first relationship is satisfied, that is, the first voltage V0 becomes higher than the second voltage.

A second relationship is set in advance for a case where the first voltage V0 is equal to the second voltages V1, V2, and V3. If the second relationship is satisfied, the switch controller 111b turns on the bidirectional switch SA and turns off the unidirectional switch SB. That is, this control is performed on the basis of whether or not the first voltage is equal to the second voltage. If the bidirectional switch SA is turned on, and the unidirectional switch SB is turned off, the battery E connected to the connector CN corresponding to this switch unit has a chargeable/dischargeable state.

If the second relationship is not satisfied, the voltage controller 111c changes the first voltage V0 such that the second relationship is satisfied, that is, the first voltage V0 becomes equal to the second voltage.

A control process performed by the control unit 111 will be described with reference to FIGS. 7 and 8. The connection determiner 111a determines whether or not a battery E is newly installed on the basis of a signal representing the second voltage obtained from each second voltage detector 113 (step S111). If the battery E1 is installed in the connector CN1 while the battery E is not connected to each connector CN (Operation No. 0 in FIG. 5), the connection determiner 111a determines that the battery E1 is newly installed on the basis of the second voltage V1 (=40 V) (YES in step S111, Operation No. 1 of FIG. 5).

In this case, the switch controller 111b determines whether or not the first voltage V0 and the second voltage V1 corresponding to the connector CN1 satisfy a predetermined first relationship (step S112). If the first voltage V0 is higher than the second voltage V1, it is determined that the first relationship is satisfied. Otherwise, it is determined that the first relationship is not satisfied. In Operation No. 1, the first voltage V0 (=55 V) is higher than the second voltage V1 (=40V). Therefore, it is determined that the first relationship is satisfied. Meanwhile, in Operation No. 3, it is determined that the first relationship is not satisfied due to the first voltage V0 (=40 V) and the second voltage V2 (=45 V). In Operation No. 7, it is determined that the first relationship is not satisfied due to the first voltage V0 (=40 V) and the second voltage V3 (=50 V).

If the switch controller 111b determines that the first relationship is not satisfied (NO in step S112), the voltage controller 111c controls the power supply unit 12 such that the first relationship is satisfied by changing the first voltage V0 (step S113). The voltage controller 111c changes the first voltage until the first relationship is satisfied. For example, in Operation No. 4, the first voltage V0 is changed to be higher (in this case, 50 V) than the second voltage V2 (=45 V). In addition, in Operation No. 8, the first voltage V0 is changed to be higher (in this case, 55 V) than the second voltage V2 (=45 V).

When the first voltage V0 is changed, the switch controller 111b changes the switch unit (including the bidirectional switch SA and the unidirectional switch SB) already set to the chargeable/dischargeable state into the only dischargeable state. That is, in Operation No. 4, the bidirectional switch SA1 changes over to OFF, and the unidirectional switch SB1 changes over to ON corresponding to the second voltage V1 (=40 V). In Operation No. 8, the bidirectional switches SA1 and SA2 change over to OFF, and the unidirectional switches SB1 and SB2 change over to ON corresponding to the second voltages V1 and V2 (=40 V). As a result, the battery E installed in the connector CN corresponding to this switch unit has the only dischargeable state. Note that, in Operation No. 4, the second voltage V1 does not follow a change of the first voltage V0. In Operation No. 8, the second voltages V1 and V2 do not follow a change of the first voltage V0.

If it is determined that the first relationship is satisfied (YES in step S112), the switch controller 111b controls the switch unit (including the bidirectional switch SA and the unidirectional switch SB) corresponding to the connector CN installed with the battery E such that the battery E has the only dischargeable state (step S114). In Operation No. 1, the first voltage V0 (=55 V) is higher than the second voltage V1 (=40 V) corresponding to the connector CN1 installed with the battery E1. In this case, the bidirectional switch SA1 changes over to OFF, and the unidirectional switch SB1 changes over to ON. In this manner, in Operation No. 4, since the first voltage V0 (=50 V) is higher than the second voltage V2 (=45 V), the bidirectional switch SA2 changes over to OFF, and the unidirectional switch SB2 changes over to ON. In Operation No. 8, since the first voltage V0 (=55 V) is higher than the second voltage V3 (=50 V), the bidirectional switch SA3 changes over to OFF, and the unidirectional switch SB3 changes over to ON. In this manner, if the first and second voltages satisfy the first relationship, the battery E has the only dischargeable state.

Subsequently, the switch controller 111b determines whether or not the first and second voltages satisfy a predetermined second relationship (step S115). If there is a second voltage equal to the first voltage V0, it is determined that the second relationship is satisfied. If there is no second voltage equal to the first voltage, it is determined that the second relationship is not satisfied. For example, in Operations Nos. 1, 4, and 8, there is no second voltage equal to the first voltage V0. Therefore, it is determined that the second relationship is not satisfied.

If the switch controller 111b determines that the second relationship is not satisfied (NO in step S115), the voltage controller 111c controls the power supply unit 12 such that the second relationship is satisfied by changing the first voltage (V0) (step S116). For example, in Operation No. 2, the first voltage V0 is changed until it becomes equal to the second voltage V1 (=40V). In addition, in Operation No. 5, the first voltage V0 is changed until it becomes equal to the second voltage V2 (=45 V). Furthermore, in Operation No. 9, the first voltage V0 is changed until it becomes equal to the second voltage V3 (=50 V).

If it is determined that the second relationship is satisfied (YES in step S115), the switch controller 111b turns on the corresponding bidirectional switch SA and turns off the corresponding unidirectional switch SB (step S117). As a result, the battery E installed in the connector CN corresponding to this switch unit has the chargeable/dischargeable state. For example, in Operation No. 2, the bidirectional switch SA1 satisfying the second relationship is turned on, and the unidirectional switch SB1 is turned off. In addition, in Operation No. 5, the bidirectional switch SA2 satisfying the second relationship is turned on, and the unidirectional switch SB2 is turned off. Furthermore, in Operation No. 9, the bidirectional switch SA3 satisfying the second relationship is turned on, and the unidirectional switch SB3 is turned off.

The switch controller 111b determines whether or not the bidirectional switch SA is turned on, and the unidirectional switch SB is turned off (step S117) corresponding to each connector CN connected to the battery E. That is, the switch controller 111b determines whether or not the switch unit corresponding to each connected battery E is controlled.

For example, in Operation No. 5, the battery E1 connected to the connector CN1 does not have the chargeable/dischargeable state. In addition, in Operation No. 9, the batteries E1 and E2 connected to the connectors CN1 and CN2, respectively, do not have the chargeable/dischargeable state (the bidirectional switch SA is not turned on, and the unidirectional switch SB is not turned off). In this case, the switch controller 111b determines that the switch unit is not controlled (NO in step S118). The switch controller 111b repeatedly performs the process of steps S115 to S118 until it is determined that the chargeable/dischargeable state is established.

Meanwhile, in Operation Nos. 2, 6, and 10, all of the batteries E installed in the connectors CN are set to the chargeable/dischargeable state. In this case, the switch controller 111b determines that the chargeable/dischargeable state is established (YES in step S118).

Through the aforementioned course, a series of control processes performed for a case where the battery E is installed are completed. Note that the process of steps S119 and S120 is similar to that of steps S107 and S108 of the first embodiment.

As described above, in the power device 1 according to the second embodiment, when the battery E is newly installed, it is determined whether or not the first and second voltages V0 and V1 to V3 satisfy a predetermined first relationship. Depending on a result of this determination, the switch unit (including the bidirectional switch SA and the unidirectional switch SB) is controlled such that electric power is supplied unidirectionally from the connector CN to the power supply unit 12. As a result, it is possible to safely perform discharging of the connected battery E and take a countermeasure even when an unexpected voltage drop (such as an instantaneous interruption) occurs in external equipment (such as the power generator G or the load L).

According to the second embodiment, in step S113, the switch controller 111b controls the switch unit (including the bidirectional switch SA and the unidirectional switch SB) already having the chargeable/dischargeable state such that the battery E installed in the connector CN corresponding to this switch unit has the only dischargeable state when the first voltage V0 is changed. However, this control may not be performed. That is, the voltage controller 111c may change the first voltage V0 while the battery E is kept in the chargeable/dischargeable state. As a result, for example, in Operation No. 4 of FIG. 8, the second voltage V1 is changed to 50 V along with the first voltage V0. In addition, in Operation No. 8, the second voltages V1 and V2 are changed to 55 V along with the first voltage V0. In this manner, the first voltage V0 may be changed while the switch unit (having the chargeable/dischargeable state) corresponding to the connector CN already connected to the battery E is kept in its state.

Although each embodiment has been described by assuming that the switch unit includes the bidirectional switch SA and the unidirectional switch SB, the switch unit may include a pair of unidirectional switches provided to change over between power supply and power cut-off states only in different directions. That is, the switch unit corresponding to the connector CN may include a first switch provided to change over between power supply and power cut-off states unidirectionally from the power supply unit 12 to the connector CN, and a second switch connected in parallel with the first switch and provided to change over between power supply and power cut-off states unidirectionally from the connector CN to the power supply unit 12.

In this case, by turning off the first switch and turning on the second switch, electric power is supplied unidirectionally from the connector CN to the power supply unit 12. That is, in this case, the only dischargeable state is established. In addition, by turning on both the first and second switches, electric power is supplied bidirectionally between the connector CN and the power supply unit 12. That is, in this case, the chargeable/dischargeable state is established. In addition, by turning off both the first and second switches, power is cut off bidirectionally between the connector CN and the power supply unit 12. That is, in this case, the non-chargeable/dischargeable state is established. The switch unit may include only the bidirectional switch SA or only the unidirectional switch SB.

Alternatively, the numbers of connectors CN, the bidirectional switches SA, and the unidirectional switches SB may be changed arbitrarily.

A commercially available power source may also be employed as an input power source of the power device 1 instead of the power generator G or along with the power generator G. In addition, the power device 1 may also be operated using the power of the battery E.

While certain embodiments have been described, these embodiments have been presented by way of example only, and are not intended to limit the scope of the inventions. Indeed, the novel apparatus and methods described herein may be embodied in a variety of other forms; furthermore, various omissions, substitutions and changes in the form of the apparatus and methods described herein may be made without departing from the spirit of the inventions. The accompanying claims and there equivalents are intended to cover such forms of modifications as would fall within the scope and spirit of the inventions.

What is claimed is:

1. A power device comprising:
  a connector detachably connected to a battery;
  a power supply unit provided between the connector and external equipment to supply electric power to the external equipment;
  a switch unit provided to change over between power supply and power cut-off states unidirectionally from the connector to the power supply unit;
  a connector-side voltage detector configured to detect a voltage of the connector side of the switch unit;
  a connection determiner configured to determine whether or not the battery is connected to the connector on the basis of the connector side voltage detected by the connector-side voltage detector; and
  a switch controller configured to control the switch unit such that electric power is supplied unidirectionally from the connector to the power supply unit when the connection determiner determines that the battery is connected.

2. The power device according to claim 1, further comprising a power supply unit-side voltage detector configured to detect a power supply unit-side voltage of the switch unit,
wherein the switch unit is provided to change over between power supply and power cut-off states bidirectionally between the connector and the power supply unit, and
the switch controller determines whether or not the connector-side voltage detected by the connector-side voltage detector and the power supply unit-side voltage detected by the power supply unit-side voltage detector satisfy a predetermined relationship, and controls the switch unit such that electric power is supplied bidirectionally between the power supply unit and the connector depending on a result of the determination.

3. The power device according to claim 2, further comprising a voltage controller configured to change the power supply unit-side voltage such that the relationship is satisfied if the switch controller determines that the relationship is not satisfied.

4. The power device according to claim 2, further comprising a power supply unit-side voltage detector configured to detect the power supply unit-side voltage of the switch unit,
wherein, when the connection determiner determines that the battery is connected, the switch controller determines whether or not the connector-side voltage detected by the connector-side voltage detector and the power supply unit-side voltage detected by the power supply unit-side voltage detector satisfy a predetermined first relationship, and controls the switch unit such that electric power is supplied unidirectionally from the connector to the power supply unit depending on a result of the determination.

5. The power device according to claim 4, further comprising a voltage controller configured to change the power supply unit-side voltage such that the first relationship is satisfied if the switch controller determines that the first relationship is not satisfied.

6. The power device according to claim 5, wherein the switch unit is provided to change over between power supply and power cut-off states bidirectionally between the connector and the power supply unit, and
the switch controller determines whether or not the connector-side voltage detected by the connector-side voltage detector and the power supply unit-side voltage detected by the power supply unit-side voltage detector satisfy a predetermined second relationship, and controls the switch unit such that electric power is supplied bidirectionally between the power supply unit and the connector depending on a result of the determination.

7. The power device according to claim 6, wherein the voltage controller changes the power supply unit-side voltage such that the second relationship is satisfied if the switch controller determines that the second relationship is not satisfied.

8. The power device according to claim 1, wherein the switch unit has
a first switch provided to change over between power supply and power cut-off states bidirectionally between the connector and the power supply unit, and
a second switch connected in parallel with the first switch and provided to change over between power supply and power cut-off states unidirectionally from the connector to the power supply unit,
the switch controller supplies electric power unidirectionally from the connector to the power supply unit by setting the first switch in the power cut-off state and setting the second switch in the power supply state, and
the switch controller supplies electric power bidirectionally between the power supply unit and the connector by setting the first switch in the power supply state and setting the second switch in the power cut-off state.

9. The power device according to claim 1, wherein the switch unit has
a first switch provided to change over between power supply and power cut-off states unidirectionally from the power supply unit to the connector, and
a second switch connected in parallel with the first switch and provided to change over between power supply and power cut-off states unidirectionally from the connector to the power supply unit,
the switch controller supplies electric power unidirectionally from the connector to the power supply unit by setting the first switch in the power cut-off state and setting the second switch in the power supply state, and
the switch controller supplies electric power bidirectionally between the power supply unit and the connector by setting the first and second switches in the power supply state.

10. The power device according to claim 1, wherein a plurality of groups of the connectors and the switch units are provided, and
the switch controller controls the switch units corresponding to all of the connectors connected to the battery such that electric power is supplied unidirectionally from the connector to the power supply unit if the connection determiner determines that the battery is connected.

11. The power device according to claim 1, wherein a plurality of groups of the connectors and the switch units are provided, and
if the connection determiner determines that the battery is connected, the switch controller determines whether or not the power supply unit-side voltage is higher for the connector-side voltages and the power supply unit-side voltages of the switch units corresponding to all of the connectors connected to the battery, and controls the switch units corresponding to all of the connectors connected to the battery such that electric power is supplied unidirectionally from the connector to the power supply unit depending on a result of the determination.

12. The power device according to claim 11, wherein the switch unit is provided to change over between power supply and power cut-off states unidirectionally from the power supply unit to the connector, and
the switch controller receives operation for selecting a group for which charging is preferentially performed out of the plurality of groups, controls the switch unit of the group selected through the operation such that electric power is supplied unidirectionally from the power supply unit to the connector, and controls the switch unit of the group not selected through the operation such that electric power is cut off.

* * * * *